United States Patent [19]

Iwamoto et al.

[11] Patent Number: 5,434,422
[45] Date of Patent: Jul. 18, 1995

[54] SAMPLE POSITION CONTROLLER IN FOCUSED ION BEAM SYSTEM

[75] Inventors: Hiroshi Iwamoto, Ibaraki; Hiroshi Hirose, Katsuta, both of Japan

[73] Assignee: Hitachi, Ltd., Tokyo, Japan

[21] Appl. No.: 205,820

[22] Filed: Mar. 4, 1994

Related U.S. Application Data

[63] Continuation of Ser. No. 940,303, Sep. 3, 1992, abandoned.

[30] Foreign Application Priority Data

Sep. 4, 1991 [JP] Japan .................................. 3-224348

[51] Int. Cl.6 ............................................ G01N 23/00
[52] U.S. Cl. .................................. 250/491.1; 250/309
[58] Field of Search .............. 250/309, 491.1; 33/706, 33/707

[56] References Cited

U.S. PATENT DOCUMENTS

| | | | |
|---|---|---|---|
| 2,886,718 | 5/1959 | Shepherd et al. | 33/706 |
| 4,791,302 | 12/1988 | Nozue | 250/491.1 |
| 4,793,067 | 12/1988 | Reimar et al. | 33/707 |
| 4,971,444 | 11/1990 | Kato | 250/491.1 |
| 5,134,298 | 7/1992 | Inagaki et al. | 250/491.1 |
| 5,136,169 | 8/1992 | Smith et al. | 250/491.1 |
| 5,168,166 | 12/1992 | Hayakawa et al. | 250/491.1 |

FOREIGN PATENT DOCUMENTS 0082639 6/1983 European Pat. Off. .

*Primary Examiner*—Bruce C. Anderson
*Attorney, Agent, or Firm*—Antonelli, Terry, Stout & Kraus

[57] ABSTRACT

Disclosed is a sample position controller in a focused ion beam system in which a reference unit quantity on a surface of a sample having a structure in which a pattern is repeated at regular intervals is calculated on the basis of the quantity of movement of the sample to which a focused ion beam is radiated and a cyclic detection signal outputted from a charged particle detector with the sample movement as changing correspondingly to the change of the arrangement structure of the surface of the sample, so that the sample position is set on the basis of the reference unit quantity while controlling the moving operation of a sample moving mechanism by using the reference point set on the sample and the reference unit quantity calculated.

21 Claims, 7 Drawing Sheets

F I G. 2
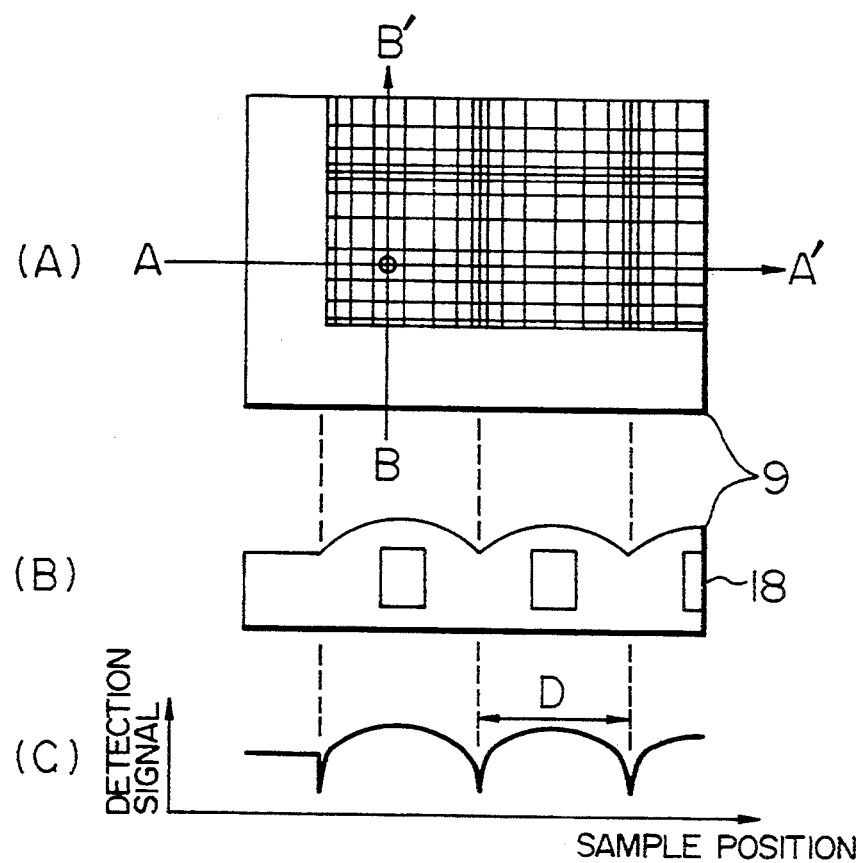

F I G. 6
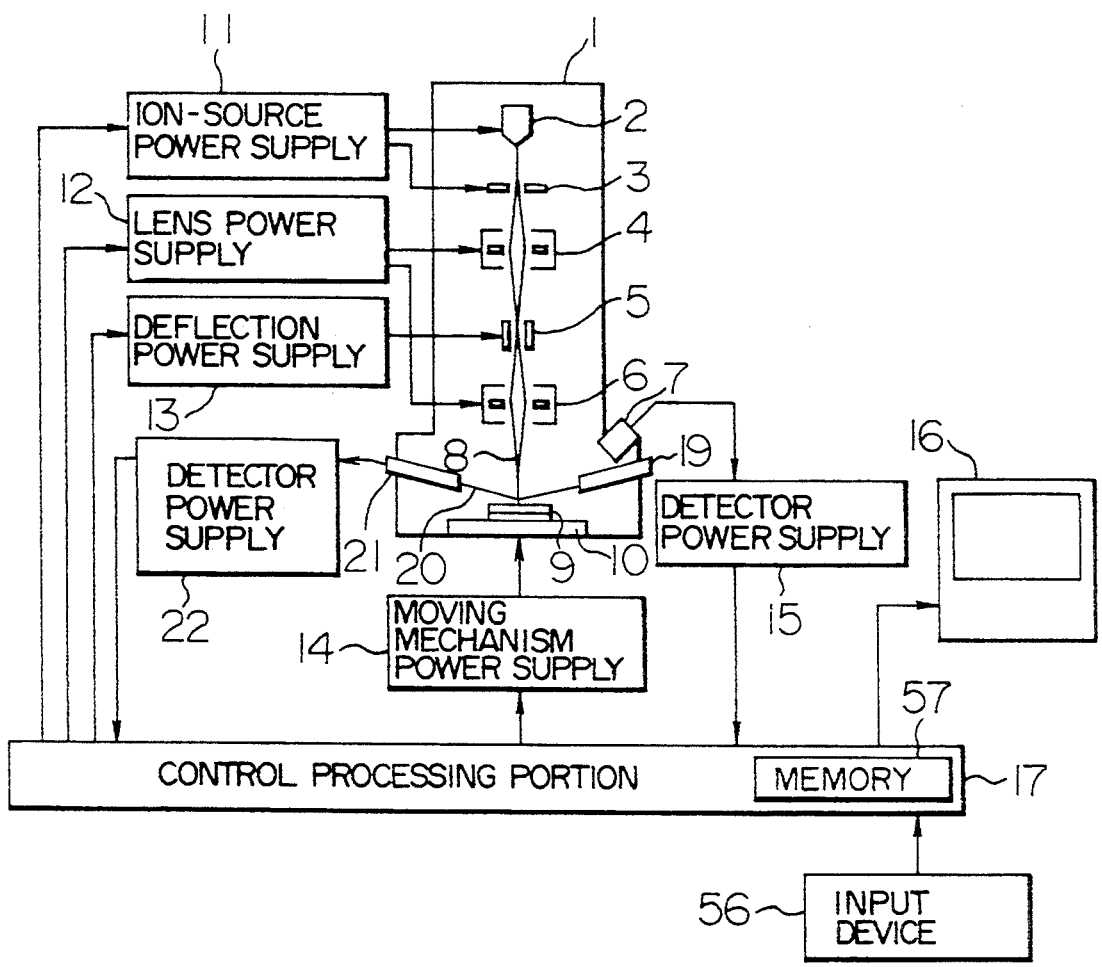

SAMPLE POSITION CONTROLLER IN FOCUSED ION BEAM SYSTEM

This application is a continuation of Ser. No. 07/940,303, filed Sep. 3, 1992, now abandoned.

BACKGROUND OF THE INVENTION

The present invention relates to a sample position controller in a focused ion beam system, and particularly relates to a sample position controller of a focused ion beam system adapted to failure analysis of a material such as a semiconductor memory element in which a pattern repeated at regular intervals exists in its surface.

The conventional focused ion beam system is generally known as a system for finely machining various kinds of materials. The system has been recently raised in estimation of the usefulness thereof as a system for analyzing a defective bit of a semiconductor memory element.

In the application of the focused ion beam system to defective bit analysis of a semiconductor memory element, firstly, the position of a failed cell in the memory element in which a failure occurs is calculated in the form of position data (address) in a bit unit which is a memory unit while all memory cells are operated actually. After the position of a defective bit in the defective memory element is determined as position data, the defective memory element is set on a movable sample stage of the focused ion beam system. Then, an operation of moving the sample stage for position control is carried out so that the defective bit portion of the defective memory element is made to come to a focused ion beam working position which is set in the focused ion beam system. After the defective bit portion is set to the focused ion beam working position, a position slightly in front of the position of a cross section to be formed in the defective bit portion is etched largely by an ion beam. Then, the side wall of the etched position is etched finely gradually to form a cross section in the target position. Finally, a cross section is formed accurately in the position of the defective bit portion. Then, this cross section is observed by using an electron microscope or the like to diagnose the failure as to the structure and kind thereof to thereby perform analysis for making an improvement in the process of producing a semiconductor memory device. Such analysis is briefly described in IEEE/IRPS, 1989, pp. 43-51.

In the aforementioned application of the focused ion beam system to defective bit analysis of a memory element, it is essential to the operation of the system that the defective bit portion is accurately moved to the focused ion beam working position. In the conventional focused ion beam system, the moving operation for position control is conducted manually by a human operator. That is, a human operator observes the sample by using the focused ion beam system to count both the number of columns of memory cells and the number of lines of memory cells to thereby obtain the target defective bit position. In this method, however, not only the counting is liable to error while the numbers are counted up to the order of hundreds or thousands but a large time is required for counting the numbers.

A proposal to improve the sample stage moving operation is disclosed in JP-A-63-312627. This proposal is however the same as the aforementioned method in that the quantity of movement of the sample stage is manually counted as the numbers of columns and lines of memory cells.

As position control techniques for adjusting the position of the sample stage, there are a device working position control system using a focused ion beam as disclosed in JP-A-2-24949 and a sample position display system of a charged particle beam analyzer as disclosed in JP-A-58-75749.

In the application of the conventional focused ion beam system to defective bit analysis, as described above, the moving operation for position control to obtain the defective bit portion is based on operator's measuring the quantity of movement while counting the number of bit portions on the surface of the memory element through observation by using a microscope or the like. In such a moving method, however, in today with the reduction of the size of bit portions as memory units and the increase of the number of bit portions caused by the enlargement of the semiconductor memory element both in density and in capacity, it is practically very difficult to accurately and rapidly move the electrically determined defective bit portion of the semiconductor memory element to a working position by means of a focused ion beam. This brings a great lowering of operating efficiency.

SUMMARY OF THE INVENTION

An object of the present invention is to provide a sample position controller in a focused ion beam system in which a defective portion of a sample having a cyclic arrangement structure on its surface such as a high-density large-capacity semiconductor memory element can be moved accurately and rapidly to a working position by means of a focused ion beam to thereby improve the operating efficiency.

The focused ion beam system according to the present invention comprises: an ion beam radiation optical system for deflecting a focused ion beam to radiate the focused ion beam to a sample; a sample moving mechanism for moving the sample while holding the sample; a movement quantity detection means for detecting the quantity of movement of the sample moved by the sample moving mechanism; a charged particle detection means for detecting charged particles released from the sample with radiation of the ion beam by the ion beam radiation optical system; a control processing means for performing focused ion beam deflection control, sample position control, charged particle detection signal storage and charged particle detection signal processing; a display means for displaying the surface state of the sample; and a reference unit quantity calculation means for calculating the reference unit quantity of the pattern change on the basis of the cyclic detection signal generated by the charged particle detection means correspondingly to the pattern change when a pattern repeated at regular intervals exists in the surface of the sample, so that the sample is moved while the sample moving mechanism is controlled on the basis of the reference point set on the sample and the reference unit quantity calculated by the calculation means.

In the aforementioned configuration, automatic movement may be performed by an operator's setting of the target movement position manually and controlling the sample moving mechanism on the basis of the reference point and the reference unit quantity, and the movement quantity may be displayed on the display means by using the reference unit quantity so that the automatic movement of the sample can be performed before the operator finds the target position through the display means.

In the aforementioned configuration, this system may have means for storing the position data of the target position calculated by another method so that the sample can be moved automatically while the sample moving mechanism is controlled on the basis of the position data of the target position, the reference point and the reference unit quantity so that the target position coincides with the focused ion beam working position.

Preferably, the reference unit quantity calculation means includes a counting means for counting the value of the number of times in the change of the detection signal generated by the charged particle detection means during the movement of the sample, and an arithmetic operation means for calculating the reference unit quantity by dividing the movement quantity from the movement quantity detection means by the value of the number of times counted by the counting means.

Preferably, the display means is arranged so that the movement quantity of the sample is displayed by using the reference unit quantity.

Preferably, the target position data is a data for movement corresponding to a real-number multiple of the reference unit quantity.

More preferably, the sample is a semiconductor memory element having a cyclic arrangement structure on its surface, the cyclic change state being cyclic repetition of one-bit reference width.

More preferably, means for radiating a beam to the surface of the sample and means for receiving/detecting a beam reflected therefrom may be added to this system or a scanning tunneling microscope may be added to this system so that the charged particle detection means can be replaced by the aforementioned means to perform the calculation of the reference unit quantity and the movement of the sample.

Particularly in the application of the focused ion beam system according to the invention to defective bit analysis of a semiconductor memory element, the bit width is calculated as a reference unit quantity by using the fact that bits are arranged regularly in the memory element, so that the movement of the sample can be performed automatically by automatically counting the movement quantity as the number of bits with respect to the reference point as a movement start point on the basis of the reference unit quantity. The reference unit quantity calculation means may be provided as software for the calculation of the reference unit quantity. Specifically, the state of the surface of the sample is displayed on the display means by using the scanning signal of the ion beam as a scanning signal for the display means and the detection signal from the charged detection means as a luminance signal for the display means while scanning an arbitrary set region on the surface of the sample centering the optical axis of the ion beam radiation optical system by narrowing the ion beam through reduction of the current quantity in the focused ion beam system. In this state, the reference unit quantity on the sample is calculated on the basis of the detection signal of the charged particle detection means changing correspondingly to the change of the pattern repeated at regular intervals on the surface of the sample and the actual movement quantity given by the movement quantity detection means. The reference unit quantity may be calculated on the basis of information displayed on the display means. The reference point is suitably set on the surface of the sample.

Then, the sample position is moved with the observation of the surface image of the sample so that the reference point coincides with the center of the ion beam scanning region. Then, in the state in which the ion beam scanning is stopped so as to be fixed to the optical axis of the ion beam radiation optical system, the sample is moved while controlling the operation of the sample moving mechanism. In the moving operation of the sample moving mechanism, the movement quantity is calculated by using the reference unit quantity as a unit on the basis of the movement quantity outputted from the moving quantity detection means and the detection signal outputted from the charged particle detection means. The calculated movement quantity is displayed.

In the focused ion beam system according to the present invention, as described above, the sample is moved through calculating the reference unit quantity of the sample and setting the reference point so that the target position of the sample calculated by another method coincides with the ion beam working position. Because the movement is based on the reference unit quantity, the movement quantity can be grasped so highly accurately that the sample can be moved rapidly to the target position.

BRIEF DESCRIPTION OF THE DRAWINGS

FIG. 2 shows the surface of a sample (semiconductor memory element), the section of the sample, and the relation between the surface shape and a detection signal in the diagrams (A), (B) and (C) respectively;

FIG. 6 is a block diagram of the focused ion beam system as a second embodiment of the present invention.

DESCRIPTION OF THE PREFERRED EMBODIMENTS

Embodiments of the present invention will be described hereunder with reference to FIGS. 1 through 7.

Figure 1:
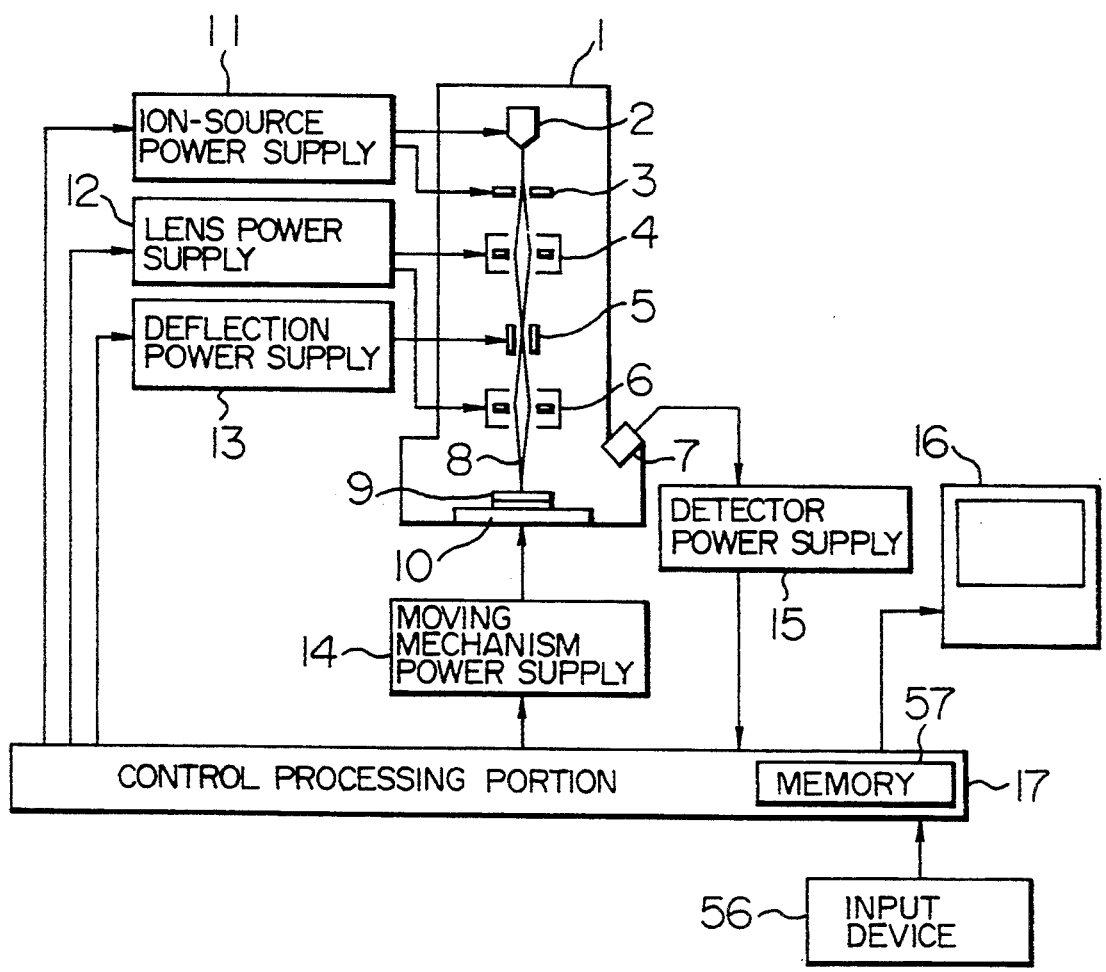
FIG. 1 is a block diagram showing an embodiment of the present invention.

FIG. 1 is a diagram showing the whole configuration of a focused ion beam system as a first embodiment of the present invention. The inside of a vacuum vessel 1 is evacuated by an exhaust device (not shown). An ion beam radiation optical system installed in the vacuum vessel 1 comprises an ion source 2, a pullout electrode 3, a condenser lens 4, deflection electrodes 5, and an objective lens 6. A moving mechanism 10 for moving a sample 9 is disposed below the ion beam radiation optical system. An ion beam 8 focused by the ion beam radiation optical system is radiated to the sample 9 supported by the moving mechanism 10. At this time, secondary electrons emitted from the sample 9 are detected by a secondary electron detector 7.

The ion beam radiation optical system further comprises an ion-source power supply 11, a lens power supply 12, and a deflection power supply 13 for respectively supplying electric power to corresponding constituent members as described above. Outputs from the ion-source power supply 11, the lens power supply 12 and the deflection power supply 13 are controlled in a control processing portion 17 by a known method. The moving mechanism 10 is driven by electric power supplied from a moving mechanism power supply 14 by a known method and is controlled in the control processing portion 17.

The input/output control of the secondary electron detector 7 is performed by a detector power supply 15, so that a detection signal generated by the secondary electron detector 7 is fed to the control processing portion 17 through the detector power supply 15. The state of the system and the surface state of the sample 9 are displayed as pictures on the basis of information delivered from the control processing portion 17 to a display device 16. In particular, imaging of the surface state of the sample 9 is performed on the basis of the output signal from the secondary electron detector.

An example of the operation of displaying the surface state of the sample 9 on the display device 16 in the focused ion beam system having the aforementioned configuration will be described hereunder.

The sample 9 is put on a stage of the moving mechanism 10 and supported thereon. First, an ion beam is generated from the ion source 2 so as to be radiated to the sample 9. Then, the generated ion beam 8 is narrowed by adjusting voltages applied to the pullout electrode 3, the condenser lens 4 and the objective lens 6. The ion beam 8 is moved on the surface of the sample 9 by a sawtooth wave voltage applied to the deflection electrode 5. At this time, the moving mechanism 10 does not operate so that the sample 9 is in a stop state. A deflection control signal given to the deflection electrode 5 is used as a scanning signal for the display device 16. The detection signal generated from the secondary electron detector 7 is used as a luminance signal for the display device 16. The state of a part region in the surface of the sample 9 is thus displayed on the display device 16 by using the control signal given to the deflection electrodes 5 and the detection signal from the secondary electron detector 7.

In the displaying operation of the focused ion beam system, the quantity of current is reduced to narrow the ion beam as compared with the case where the sample surface is etched by the beam. The scanning signal of the ion beam and the detection signal of the secondary electron detector 7 are respectively used as a scanning signal and as a luminance signal for the display device 16, so that the surface state of the sample 9 is displayed while the damage of the sample 9 is suppressed. When the surface of the semiconductor memory element is observed by using the focused ion beam system on the basis of the aforementioned displaying operation, the regular bit arrangement structure in which a pattern is repeated at regular intervals can be observed as contrast in the change of the detection signal corresponding to the bit change.

The relation between the surface of the sample 9 and the detection signal of the secondary electron detector 7 in the aforementioned case will be described in detail with reference to the diagrams (A) to (C) of FIG. 2. The following description shows the case where the sample 9 is a semiconductor memory element.

The diagram (A) of FIG. 2 shows an image of the surface of the sample 9. In the image, the dense solid line portion shows a dark portion, the sparse solid line portion shows a light portion and the other portion shows a flat portion. Because the sample is a semiconductor memory element, a large number of bit constituent portions are shown as the surface image of the sample 9. The surface of the sample 9 constituted by a large number of bit constituent portions exhibits a memory cell arrangement structure in which a pattern is repeated at regular intervals. The diagram (B) of FIG. 2 shows the structure of a section taken along the line A—A' in the diagram (A) of FIG. 2. The diagram (C) of FIG. 2 shows the state of the detection signal of the secondary electron detector 7 in the case where the ion beam 8 is moved along the line A—A' in the diagram (A) of FIG. 2.

In the diagram (B) of FIG. 2, three bit constituent portions 18 which are memory units in the semiconductor memory element are displayed. As shown in the diagram (B) of FIG. 2, unevenness exists in each bit constituent portion 18 in the surface of the memory element as the sample 9, so that a change as shown in the diagram (C) of FIG. 2 occurs in the detection signal correspondingly to the unevenness. In the case where the sample 9 is a semiconductor memory element, the sample 9 has an arrangement structure in which a pattern formed by a bit constituent portion 18 is repeated at regular intervals on its surface, because the semiconductor memory element has a very large number of bit portions. Accordingly, the detection signal of the secondary electron detector 7 has a cyclic signal characteristic based on the aforementioned bit constituent portions 18. Accordingly, when the detection signal of the secondary electron detector 7 is obtained, the distance D shown in the diagram (C) of FIG. 2 can be Calculated on the basis of the cyclic characteristic of the detection signal and the data of the actual movement quantity. The data of the actual movement quantity can be obtained by a configuration composed of the moving mechanism 10, the moving mechanism power supply 14 and the control processing portion 17. That is, when the movement quantity by means of the moving mechanism 10 is represented by L, L can be calculated on the basis of the control signal of the moving mechanism 10 by a known method. A counting means such as a digital coordinate measurer described in "Tool Measurement" by Akira Yamamoto, Feb. 20, 1971, pp. 52-54, a laser scale described in SONY Catalog No. 285, pp. 1-4 or the like may be further provided to detect the movement quantity L. The distance D thus obtained is a distance between two points in which sudden changes occur in the detection signal in the diagram (C) of FIG. 2. The distance D is defined as a reference unit quantity. The reference unit quantity D is a unit width of a bit constituent portion on the surface of the sample 9 as a semiconductor memory element.

The aforementioned detection signal generated by the secondary electron detector 7 is used for displaying the surface of the sample 9 on the display device 16. As described above, the bit arrangement on the surface of the sample 9 can be observed on the display device 16. Accordingly, the aforementioned distance D can be obtained on the basis of the enlargement ratio of the bit arrangement image.

In the diagram (A) of FIG. 2, an end portion of the arrangement of bit constituent portions is shown so that a bit constituent portion in an intersection of the line A—A' and the line B—B' shows an end bit. The end bit portion determined as an intersection of the line A—A' and the line B—B' is used as a reference point. The reference point serves as a movement start point in the case where movement (which will be described later) is performed by using the focused ion beam system.

In practical use, the calculation of the reference unit quantity D is performed by a reference unit quantity calculation means included as software in the control processing 17 having a data processing function. The reference unit quantity calculation means calculates the reference unit quantity on the basis of the cyclic detection signal generated by the secondary electron detector 7 correspondingly to the cyclic pattern change when a pattern is repeated at regular intervals on the surface of the sample. More in detail, the reference unit quantity calculation means is composed of a counting means for counting the number of times in the change of the detection signal generated by the secondary electron detector 7 during the movement of the sample 9, and an arithmetic operation means for calculating the reference unit quantity by dividing the detected movement quantity of the sample by the number of times counted by the counting means. The secondary electron detector 7 may be generally replaced by a charged particle detector.

Figure 3:
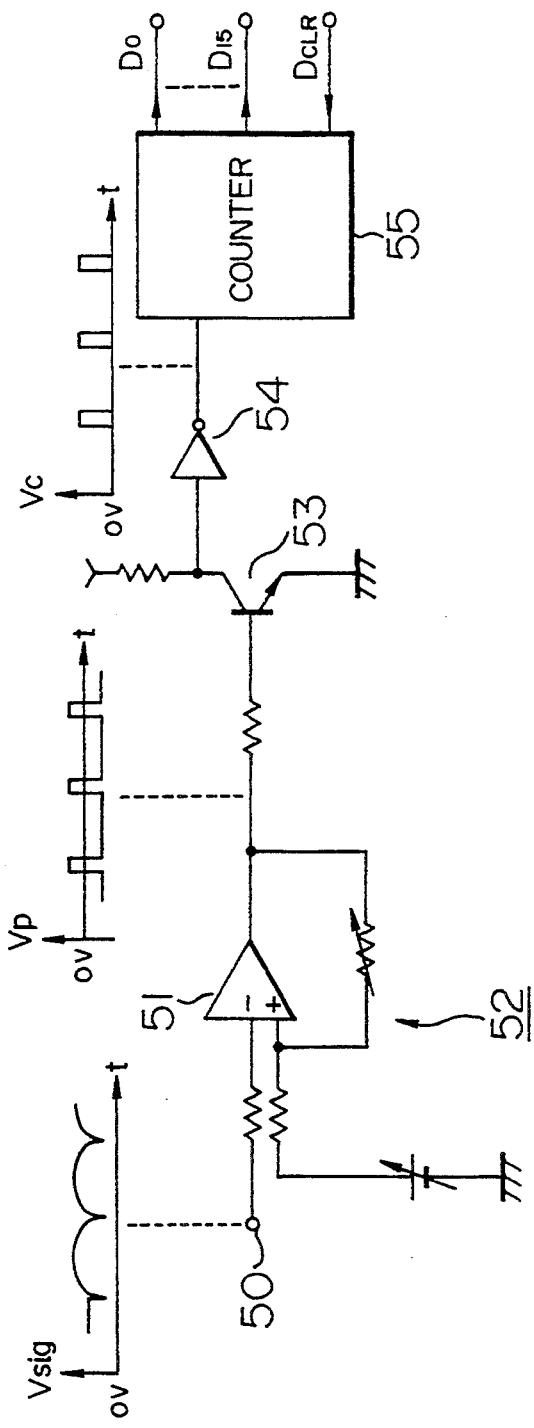
FIG. 3 is a circuit diagram showing important part of the system depicted in FIG. 1.

More in detail, the counting means is provided in the inside of the detector power supply 15 to form a circuit structure as shown in FIG. 3. In FIG. 3, the signal $V_{sig}$ detected by the detector 7 and shown in the diagram (C) of FIG. 2 is supplied to an input terminal 50 and converted into a pulse signal $V_p$ through a comparison circuit 52 including an operation amplifier 51. The pulse signal $V_p$ is then converted into a TTL-level pulse train $V_c$ through a transistor 53 and an inverter 54. The pulse train shows pulses expressing points of time in the trough portions in the diagram (C) of FIG. 2. The pulse train is counted up by a counter 55. The count value thereof is given to data lines $D_0$–$D_{15}$. The line $D_{CLR}$ is used for supplying a clear signal to clear up the counter 55 at the time of the starting of the driving operation of the moving mechanism 10.

In the aforementioned displaying operation, the quotient obtained by dividing the movement quantity L by the reference unit quantity D is used so that the movement quantity L of the sample can be displayed on the display device 16 by using an integral multiple of the reference unit quantity D, that is, by using the reference unit quantity as a unit.

In the case where the reference unit quantity D is already known, the movement quantity expressed by using the reference unit quantity D as a unit can be also found from the number of times of occurrence of the sudden change in the detection signal of the secondary electron detector 7. Accordingly, the movement quantity can be found more accurately to be displayed more accurately by comparing the movement quantity L based on the moving mechanism 10 with the movement quantity (D×(count)) based on the detection signal and confirming that the two coincide with each other. If the two do not coincide with each other, the moving operation must be restarted.

Also with respect to the line B—B' in the diagram (A) of FIG. 2, the movement quantity of the sample 9 can be displayed by using the reference unit quantity D through moving the sample 9 in the same manner as described above.

An example of the operation in which the focused ion beam system is applied to defective bit analysis of a semiconductor memory element will be described hereunder. This example of the operation is characterized in that the movement of the sample 9 is performed automatically by using the reference point and the reference unit quantity so that the defective bit portion as a target position coincides with the ion beam working position.

The sample 9 is a semiconductor memory element. The defective bit portion as a moving target position in the semiconductor memory element is electrically obtained as position data by another means. The obtained position data related to the target position is stored in a memory 57 of the control processing portion 17 through an input device 56. The target position is thus given preliminarily. The position data is generally expressed as an address which is expressed by the number of bits in the X direction and the number of bits in the Y direction when the address of a bit at a corner portion is zero.

In the aforementioned state, the sample 9 is put on the stage of the moving mechanism 10 in the focused ion beam system. This state is shown in FIG. 1. As described above with reference to FIGS. 1 and 2, the reference unit quantity is calculated by the reference unit quantity calculation means through moving the ion beam in the state in which the sample 9 is disposed on the moving mechanism 10 of the focused ion beam system. Further, the reference point is determined. The reference point is an intersection of the line A—A' and the line B—B' and shows a bit constituent portion at the left lower end of the semiconductor memory element in the diagram (A) of FIG. 2. The reference unit quantity is expressed as the distance D. As shown in the diagram (A) of FIG. 2, the sample 9 is partially displayed on the display device 16 having a monitor function. In the image displayed on the display device 16, the sample is initially displayed in a low enlargement ratio to adjust the sample position to the center of the display by using the moving mechanism 10, and then the enlargement ratio is increased to make the reference point come to the center of the display accurately. Accordingly, the reference point can be grasped exactly and set accurately.

Then, the movement of the sample is performed. For the moving operation, the sample 9 is moved by the moving mechanism 10 while the display device 16 is seen so as to make the reference point come to the center of the scanning region of the ion beam 8. Then, the sample 9 is moved along the line A—A' in the diagram (A) of FIG. 2 while the moving mechanism 10 is controlled. The movement of the sample 9 is performed on the basis of the setting of the distance from the reference point on the sample 9 to the target position as an integral multiple of the reference unit quantity D. That is, the sample 9 can be automatically moved to the target position by a simple operation of setting the distance from the reference point to the moving target position as an integral multiple of the reference unit quantity D. In this case, the enlargement ratio is generally set with respect to two directions intersecting each other at right angles because the sample 9 is displayed on a two-dimensional plane. As the state of the ion beam 8 moving to the target position, the voltage applied to the deflection electrodes 5 may be changed as widely as possible to suppress the radiation of the ion beam 8 to the sample to thereby avoid the damage of the surface of the sample 9 or the ion beam 8 may be fixed to the center of the scanning region. In the latter case, a detection signal having the same waveform as shown in the diagram (C) of FIG. 2 is obtained with the movement of the sample 9 so that the sample can be moved to the target position on the basis of the detection signal. In the former case, the sample is moved to the target position by measuring the distance obtained by the product of the reference unit quantity and the defective bit position data as the movement quantity of the sample by using a measurement means such as a laser scale or the like.

When the state of the surface of the sample 9 is displayed after the voltage applied to the deflection electrode 5 is returned to the original sawtooth wave voltage, the center position of the display region on the display device 16 coincides with the target position obtained as a result of the movement from the reference point by using the reference unit quantity D.

As described above, the position of the defective bit portion in the semiconductor memory element can be electrically preliminarily grasped by using the reference unit quantity as a unit. Accordingly, the defective bit portion can be moved rapidly to the center of the scanning region as the ion beam 8 working position by moving the sample 9 through the moving mechanism 10 on the basis of the reference unit quantity D. After the movement is completed, the position of radiation of the ion beam 8 coincides with the target position of the sample 9, that is, the defective bit portion of the sample 9. Accordingly, in the state in which the ion beam 8 is set on the sample 9, a necessary working can be applied to the defective bit portion of the semiconductor memory element, that is, the portion to be processed, by using the ion beam 8.

Figure 4:
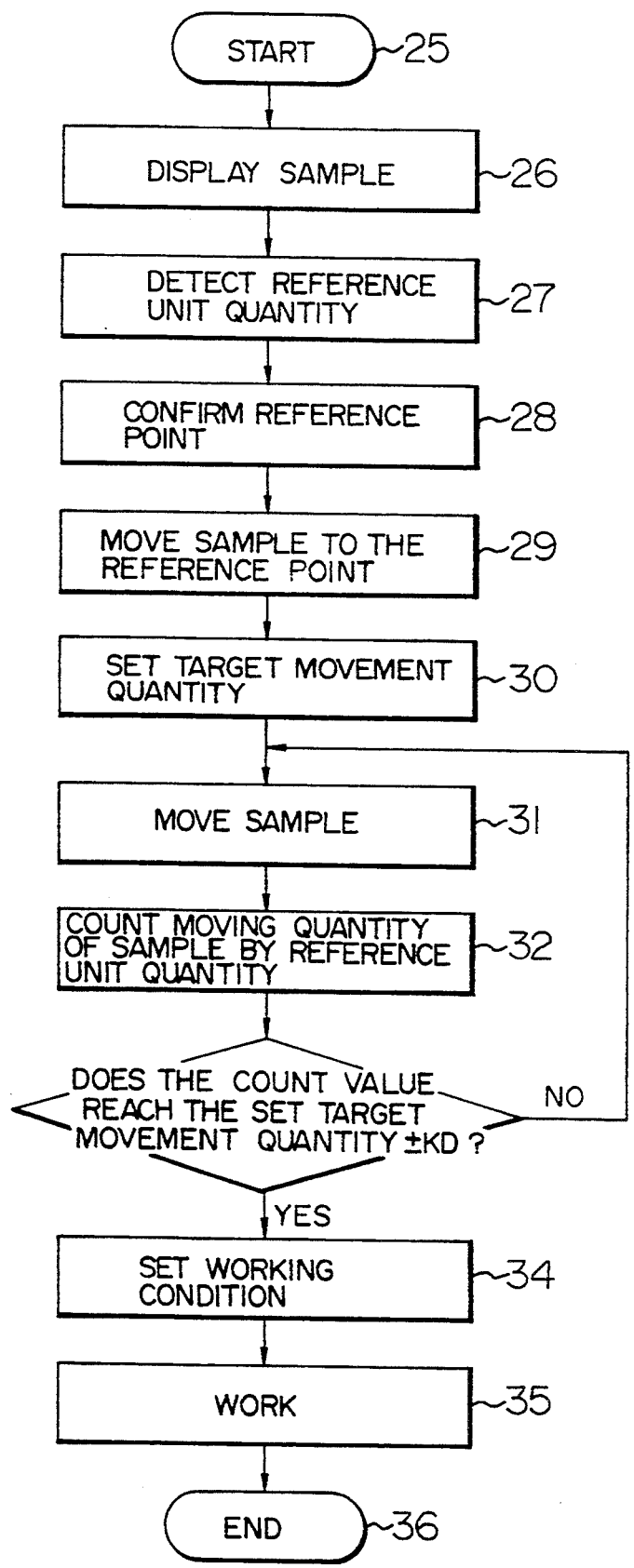
FIG. 4 is a flow chart showing the operation of the system of from the movement of the sample to the working on the sample in the embodiment of the present invention.

In the focused ion beam system, the aforementioned operation from the displaying/movement to the working of the sample 9 having a structure in which a pattern is repeated at regular intervals on its surface will be described with reference to the flow chart of FIG. 4.

First, the ion beam radiation optical system is adjusted to start the procedure related to the movement (step 25). Then, the state of the surface of the sample 9 is displayed on the display device 16 by raster scanning of the ion beam 8 so that the state can be observed (step 26), Then, the reference unit quantity (bit width) D on the surface of the sample 9 is calculated with respect to the vertical and horizontal directions by dividing the movement quantity of the sample by the count number of pulses generated with the movement of the sample in the same manner as described above (step 27). Further, the reference point of the bit constituent portion is confirmed from the image displayed on the display device 16 (step 28).

Then, the sample 9 is moved so that the reference point thus confirmed coincides with the center position of the raster scanning, by controlling the moving operation of the moving mechanism 10 through the control processing portion 17 (step 29).

Then, the target movement quantity as an integral multiple (including a real-number multiple) of the reference unit quantity D is inputted into the control processing portion 17 through the input device 56 and stored in the memory thereof (step 30). The target position is a position of the defective bit portion. The position data of the defective bit portion is obtained electrically by another method. Then, the sample 9 is moved correspondingly to the inputted movement quantity (step 31) and then the movement quantity thereof is counted on the basis of the reference unit quantity (bit width unit) (step 32).

A judgment is made as to whether or not the value counted by the step 32 reaches the movement quantity inputted by the step 30. The judgment is based on the target movement quantity±KD (K: an arbitrary set value of 0 to 0.25, D: reference unit quantity). Even in the case where the value of K is 0.25 so that the allowable range is maximized, the difference between the center of the raster scanning and the center of the defective bit is one-fourth as much as the reference unit quantity D so that the target defective bit is never mistaken for another bit. When the value does not reach the movement quantity, the situation of the routine goes back to the step 31. When the value reaches the movement quantity, the situation of the routine goes to the next step (step 33).

Thereafter, a working condition such as a region to be worked or the like is set (step 34) and then working is made under the thus set working condition and in the working position (step 35). After the working is completed, the operation is terminated (step 36).

Although the aforementioned moving and working operation shows the case where the judgment in the step 33 is made automatically, the invention can be applied to the case where the target position may be set suitably by the human operator without preliminarily exactly setting of the target movement quantity so that the sample 9 can be moved on the basis of operator's judgment as to whether or not the position of the sample coincides with the target position. In the latter case, the procedure of from the step 30 to the step 33 in FIG. 4 may be replaced by another procedure in FIG. 5.

Figure 5:
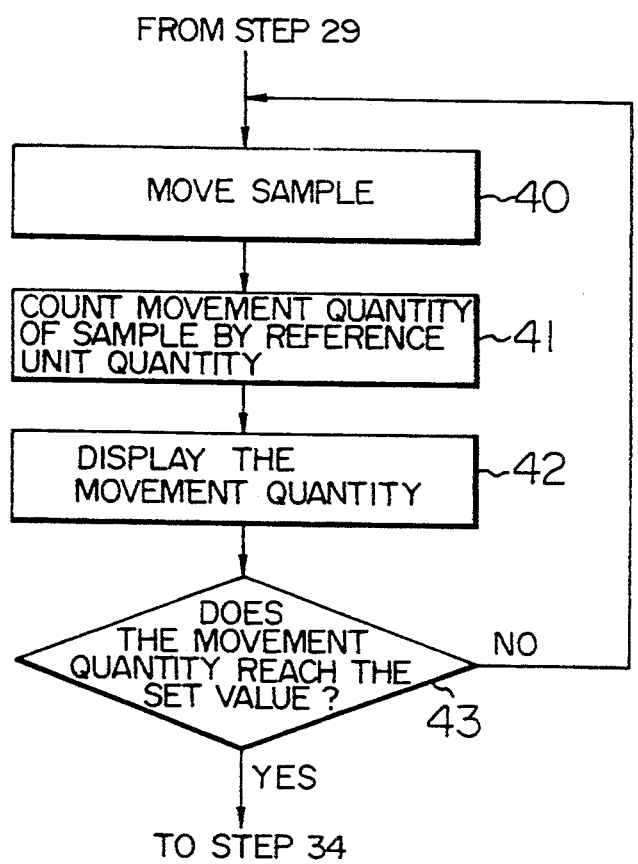
FIG. 5 is a flow chart showing a partly modified example of the operation depicted in FIG. 4.

The procedure will be described with reference to FIG. 5. First, an operation of moving the sample 9 by using the reference unit quantity D as a unit is started (step 40). While the sample 9 is moved, the movement quantity thereof is counted by using the reference unit quantity D as a unit (step 41). The movement quantity of the sample 9 obtained on the basis of the counted value by using the reference unit quantity D as a unit is displayed on the display device 16 (step 42). While confirming the displayed movement quantity, the operator judges whether the movement quantity of the sample reaches the target movement quantity (target position). When the movement quantity does not reach the target, the situation of the routine goes back to the step 40. When the movement quantity reaches the target, the situation of the routine goes to the next step 34 (step 43). The judgment in the step 43 is made manually by the operator. The aforementioned movement is automatically performed except the step 43, so that the sample can reach the target position very easily.

The effect of the moving method in the aforementioned embodiment using the focused ion beam system will be described specifically hereunder.

It is now assumed that the semiconductor element used as the sample 9 is 4Mbit-DRAM. In the case of 4Mbit-DRAM, 2000×2000 bits are arranged in practical use. The occupied area per bit is about 2 $\mu$m×2 $\mu$m. If the enlargement ratio is set to 2000 to make bit identification exact, the area of the sample allowed to be displayed on the display device 16 of 20 cm×20 cm identify the bits is 100 cm×100 cm in which 50×50 bits are contained. In this enlargement ratio, the sample position is moved from an end of the bit arrangement to the center thereof (as the target position). If the movement is performed by a conventional moving method while the number of bits is counted manually, the operation repeated 20×20 times is required for passing through the region of 1000×1000 bits. Assuming now that the time of 10 seconds is required for one-scene's counting and movement, then the total time of about 67 minutes is required for moving the sample.

When this embodiment is applied to the case of the aforementioned sample, even on the assumption that the movement of the sample 9 is 50 cm per second, the movement of the sample can be completed in about seven minutes being one-tenth as much as the aforementioned total time. Accordingly, the moving time can be shortened greatly.

A second embodiment of the present invention will be described hereunder with reference to FIG. 6. In FIG. 6, this embodiment is formed by adding a light source 19, a received-light detector 21 and a received-light detector power supply 22 to the configuration of FIG. 1.

A beam 20 narrowed correspondingly to the bit width is radiated from the light source 19 to the surface of the sample 9, so that a beam reflected therefrom is received by the received-light detector 21. An analog signal from the received-light detector 21 is converted into a digital signal by the received-light detector power supply 22, so that the digital signal as digital data is transmitted to the control processing portion 17. Here, the position of radiation of the beam from the light source 19 is set in the vicinity of the position where the ion beam 8 is fixed. When the sample 9 is then moved, the same change as shown in the diagram (C) of FIG. 2 is produced in the signal of the received-light detector 21 by the change of the reflected beam caused by the unevenness of the surface of the sample. Therefore, the signal from the secondary electron detector 7 used in the embodiment of FIG. 1 as described above is replaced by the signal from the received-light detector 21 with respect to the calculation of the reference unit quantity of the sample and the determination of the reference point. The same procedure as described above with reference to FIG. 1 can be applied to the grasping of the movement quantity of the sample. Further, in this embodiment, it is unnecessary to radiate the ion beam 8 to the sample 9 during the movement of the sample 9. Accordingly, the damage of the surface of the sample caused by the radiation of the ion beam 8 to the sample can be prevented by changing the voltage applied to the deflection electrodes 5.

A third embodiment of the present invention will be described hereunder with reference to FIG. 7.

Figure 7:
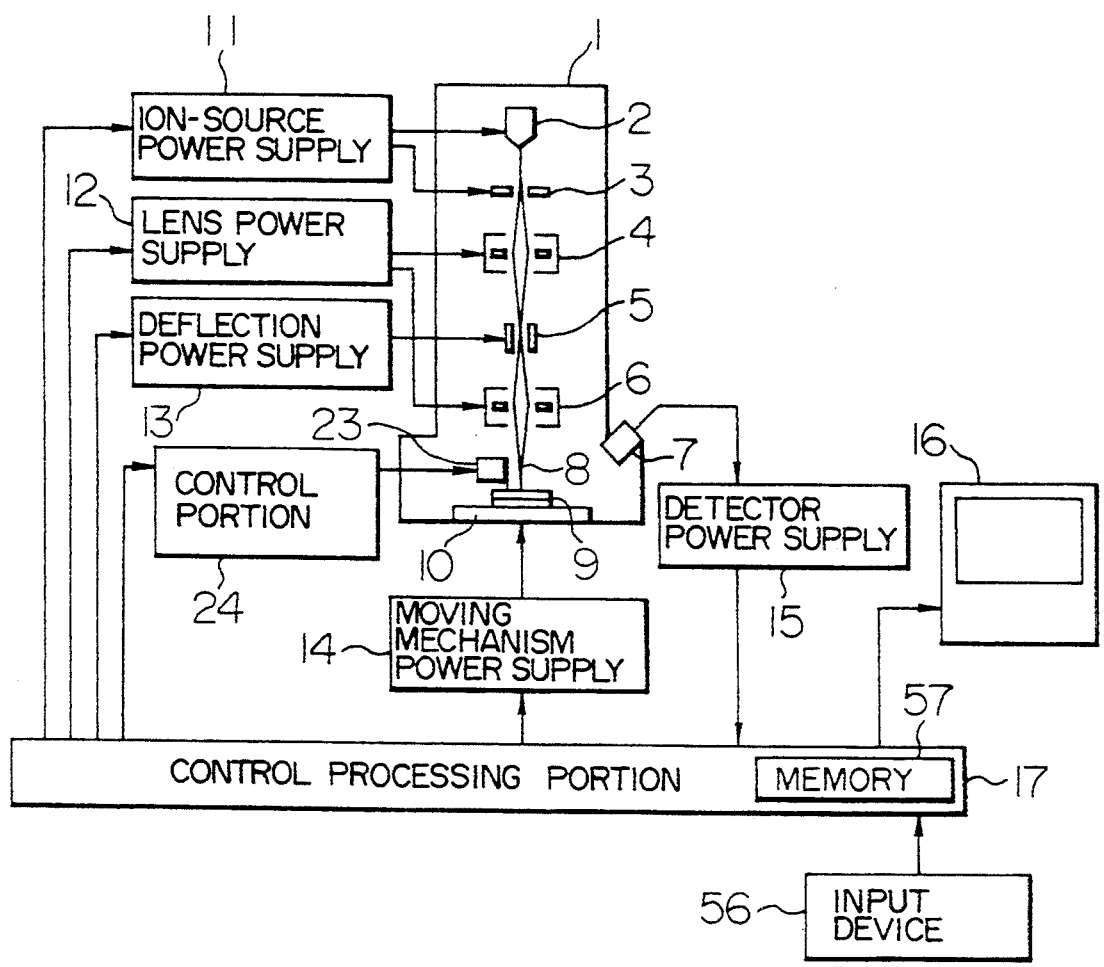
FIG. 7 is a block diagram of the focused ion beam system as a third embodiment of the present invention.

In FIG. 7, the third embodiment is formed by adding a probe driving portion 23 and a control portion 24 for the scanning tunneling microscope to the structure of FIG. 1.

A probe in the probe driving portion 23 is set in the vicinity of the scanning region of the ion beam 8. With respect to the movement of the sample 9, information of the height of the probe which changes correspondingly to the unevenness of the sample 9 can be obtained by the probe driving portion 23 and the control portion 24 when the sample is moved after the probe is moved to the center of the ion beam scanning range by an ordinary probe moving method. The same procedure as described above with reference to FIG. 1 can be applied to the grasping of the movement quantity of the sample 9 by using this information instead of the signal from the secondary electron detector 7 used in the embodiment of FIG. 1 as described above.

Further, in this embodiment, it is unnecessary to radiate the ion beam 8 to the sample 9 during the movement of the sample 9. Accordingly, the damage of the surface of the sample caused by the radiation of the ion beam 8 to the sample can be prevented in the same manner as in the second embodiment.

According to the present invention, in the case where a sample having a regular arrangement structure such as a bit arrangement of a semiconductor memory element is moved, the movement of the sample can be performed rapidly and exactly by grasping the movement quantity of the sample on the basis of the reference unit quantity. Accordingly, the operating efficiency can be improved. Particularly, in the application of the system to defective bit analysis of a semiconductor memory element, the sample can be automatically rapidly moved to the defective bit portion as the target position in a large number of bits arranged therein.

The movement quantity of the sample can be grasped by using the reference unit quantity as a unit through comparing the movement quantity of the sample based on the sample moving mechanism with the movement quantity calculated on the basis of the reference unit quantity and displaying the movement quantity of the sample on the display device by using the reference unit quantity. Accordingly, the accuracy of the movement quantity can be improved more greatly.

The necessity of radiating the ion beam to the sample during the movement of the sample is eliminated by using the received-light detection signal or tunnel-current detection signal instead of the charged particle detection signal. Accordingly, the damage of the surface of the sample can be prevented.

We claim:

1. A sample position controller in a focused ion beam system comprising an ion beam radiation optical system for deflecting a focused ion beam to radiate said focused ion beam to a sample, a sample moving mechanism for moving said sample while holding said sample, a movement quantity detection means for detecting the quantity of movement of said sample moved by said sample moving mechanism, a charged particle detection means for detecting charged particles released from said sample with radiation of the ion beam by said ion beam radiation optical system, a control processing means for performing focused ion beam deflection control, sample position control, charged particle detection signal storage and charged particle detection signal processing, and a display means for displaying the surface state of said sample, wherein said sample position controller further comprises:

means for detecting a cyclic signal with the movement of said sample correspondingly to a cyclic pattern substantially repeated at regular intervals in the surface of said sample;

a reference unit quantity calculation means for calculating a reference unit quantity expressing the cycle length of the pattern repeated at regular intervals, on the basis of the cyclic signal and the movement quantity detected by said movement quantity detection means;

a target position setting means for setting a target position of said sample relative to a reference point on said sample, in the form of target position data expressed by using the reference unit quantity as a unit; and a moving means for moving said sample while controlling said sample moving mechanism so that a surface at said target position is displayed using said display means.

2. A sample position controller in a focused ion beam system according to claim 1, wherein:

said display means includes means for displaying said target position data and said movement quantity of said sample relative to said reference point by using said reference unit quantity; and said moving means includes means for driving said sample moving mechanism on the basis of said reference point and said target position data until the movement quantity displayed by said display means substantially coincides with said target position data.

3. A sample position controller in a focused ion beam system according to claim 1, wherein said moving means includes means for storing said target position data, and means for automatically moving said sample while controlling said sample moving mechanism on the basis of said target position data and said reference point until said target position coincides with a focused ion beam working position.

4. A sample position controller in a focused ion beam system according to claim 3, wherein said target position data is a data expressing a movement distance equivalent to an integral multiple of said reference unit quantity.

5. A sample position controller in a focused ion beam system according to claim 1, wherein said sample is a semiconductor memory element having a structure in which a pattern repeated at regular intervals exists in its surface so that one cycle of said repeated pattern is equivalent to one bit.

6. A sample position controller in a focused ion beam system according to claim 1, wherein said reference unit quantity calculation means includes a counting means for counting the value of the number of times in the change of the detection signal generated by said charged particle detection means during the movement of said sample, and an arithmetic operation means for calculating said reference unit quantity by dividing the movement quantity from said movement quantity detection means by the value of the number of times counted by said counting means.

7. A sample position controller in a focused ion beam system according to claim 1, wherein said display means includes means for displaying the movement quantity of said sample by using said reference unit quantity.

8. A sample position controller in a focused ion beam system according to claim 1, wherein said cyclic signal detection means is constituted by a circuit for performing detection on the basis of the signal from said charged particle detection means.

9. A sample position controller in a focused ion beam system according to claim 1, wherein said cyclic signal detection means includes means for radiating an optical beam to the surface of said sample, and means for receiving an optical beam reflected at the surface of said sample.

10. A sample position controller in a focused ion beam system according to claim 1, wherein said cyclic signal detection means is constituted by a scanning tunneling microscope.

11. A sample position controller in a focused ion beam system comprising an ion beam radiation optical system for deflecting a focused ion beam to radiate said focused ion beam to a circuit structure surface of a semiconductor circuit having a circuit structure pattern repeated at regular intervals along the surface thereof, a sample moving mechanism for moving said semiconductor circuit while holding said semiconductor circuit, a movement quantity detection means for detecting the quantity of movement of said semiconductor circuit moved by said sample moving mechanism, a charged particle detection means for detecting charged particles released from said circuit structure surface with radiation of the ion beam by said ion beam radiation optical system, a control processing means for performing focused ion beam deflection control, sample position control, charged particle detection signal storage and charged particle detection signal processing, and a display means for displaying the surface state of said semiconductor circuit, wherein said sample position controller further comprises:

means for detecting a cyclic signal with the movement of said semiconductor circuit correspondingly to a cyclic pattern substantially repeated at regular intervals along said circuit structure surface;

a reference unit quantity calculation means for calculating a reference unit quantity expressing the one-cycle length of the cyclic pattern repeated at regular intervals, on the basis of the cyclic signal and the movement quantity detected by said movement quantity detection means;

a target position setting means for setting a target position of said semiconductor circuit relative to a reference point on said semiconductor circuit, in the form of target position data expressed by using the reference unit quantity as a unit; and a moving means for moving said semiconductor circuit while controlling said sample moving mechanism so that a surface at said target position is displayed substantially in the center of said display means.

12. A sample position controller in a focused ion beam system comprising an ion beam radiation optical system for deflecting a focused ion beam to radiate said focused ion beam to a sample, a sample moving mechanism for moving said sample while holding said sample, a movement quantity detection means for detecting the quantity of movement of said sample moved by said sample moving mechanism, a charged particle detection means for detecting charged particles released from said sample with radiation of the ion beam by said ion beam radiation optical system, a control processing means for performing focused ion beam deflection control, sample position control, charged particle detection signal storage and charged particle detection signal processing, and a display means for displaying the surface state of said sample, wherein said sample position controller further comprises:

means for detecting a cyclic signal with the movement of said sample correspondingly to a cyclic pattern substantially repeated at regular intervals in the surface of said sample;

a reference unit quantity calculation means for calculating a reference unit quantity expressing the one-cycle length of the pattern repeated at regular intervals, on the basis of the cyclic signal and the movement quantity detected by said movement quantity detection means:

a target position setting means for setting a target position of said sample relative to a reference point on said sample, in the form of target position data expressed by using the reference unit quantity as a unit; and a moving means for moving said sample while controlling said sample moving mechanism so that a surface at said target position is displayed substantially in the center of said display means.

13. A sample position controller in a focused ion beam system according to claim 12, wherein:
said display means includes means for displaying said target position data and said movement quantity of said sample relative to said reference point by using said reference unit quantity; and
said moving means includes means for driving said sample moving mechanism on the basis of said reference point and said target position data until the movement quantity displayed by said display means substantially coincides with said target position data.

14. A sample position controller in a focused ion beam system according to claim 12, wherein said moving means includes means for storing said target position data, and means for automatically moving said sample while controlling said sample moving mechanism on the basis of said target position data and said reference point until said target position coincides with a focused ion beam working position.

15. A sample position controller in a focused ion beam system according to claim 14, wherein said target position data is a data expressing a movement distance equivalent to an integral multiple of said reference unit quantity.

16. A sample position controller in a focused ion beam system according to claim 12, wherein said sample is a semiconductor memory element having a structure in which a pattern repeated at regular intervals exists in its surface so that one cycle of said repeated pattern is equivalent to one bit.

17. A sample position controller in a focused ion beam system according to claim 12, wherein said reference unit quantity calculation means includes a counting means for counting the value of the number of times in the change of the detection signal generated by said charged particle detection means during the movement of said sample, and an arithmetic operation means for calculating said reference unit quantity by dividing the movement quantity from said movement quantity detection means by the value of the number of times counted by said counting means.

18. A sample position controller in a focused ion beam system according to claim 12, wherein said display means includes means for displaying the movement quantity of said sample by using said reference unit quantity.

19. A sample position controller in a focused ion beam system according to claim 12, wherein said cyclic signal detection means is constituted by a circuit for performing detection on the basis of the signal from said charged particle detection means.

20. A sample position controller in a focused ion beam system according to claim 12, wherein said cyclic signal detection means includes means for radiating an optical beam to the surface of said sample, and means for receiving an optical beam reflected at the surface of said sample.

21. A sample position controller in a focused ion beam system according to claim 12, wherein said cyclic signal detection means is constituted by a scanning tunneling microscope.

* * * * *